(12) United States Patent
Tang et al.

(10) Patent No.: US 9,584,109 B2
(45) Date of Patent: Feb. 28, 2017

(54) VOLTAGE REGULATOR AND RESONANT GATE DRIVER THEREOF

(71) Applicant: Huawei Technologies Co., Ltd., Shenzhen, Guangdong (CN)

(72) Inventors: Yangyang Tang, Shenzhen (CN); Chen-Xiong Zhang, Plano, TX (US)

(73) Assignee: Huawei Technologies Co., Ltd., Shenzhen (CN)

( * ) Notice: Subject to any disclaimer, the term of this patent is extended or adjusted under 35 U.S.C. 154(b) by 239 days.

(21) Appl. No.: 14/533,748

(22) Filed: Nov. 5, 2014

(65) Prior Publication Data

US 2015/0188531 A1    Jul. 2, 2015

(30) Foreign Application Priority Data

Dec. 26, 2013   (CN) .......................... 2013 1 0733241

(51) Int. Cl.
*H03K 17/0412*    (2006.01)
*H03K 17/041*    (2006.01)
(Continued)

(52) U.S. Cl.
CPC ...... *H03K 17/04106* (2013.01); *H02M 1/088* (2013.01); *H03K 17/04123* (2013.01);
(Continued)

(58) Field of Classification Search
CPC .. H03K 17/102; H03K 17/122; H03K 17/161; H03K 17/302; H03K 17/56; H03K 19/00346; H03K 3/012
(Continued)

(56) References Cited

U.S. PATENT DOCUMENTS 5,196,995 A  *  3/1993  Gulczynski ........... H02M 3/158
                                                   323/224
7,110,265 B2    9/2006  Liu et al.
(Continued)

FOREIGN PATENT DOCUMENTS

CN          1849748 A    10/2006

OTHER PUBLICATIONS

Ma et al., "Dual Channel Pulse Resonant Gate Driver," Second IEEE Conference on Industrial Electronics and Applications, pp. 2317-2321, Institute of Electrical and Electronics Engineers, New York, New York (May 23-25, 2007).
(Continued)

*Primary Examiner* — Timothy J Dole
*Assistant Examiner* — Bryan R Perez
(74) *Attorney, Agent, or Firm* — Leydig, Voit & Mayer, Ltd.

(57) ABSTRACT

The present invention relates to a voltage regulator and a resonant gate driver of the voltage regulator, where the resonant gate driver is configured to drive a first power transistor and a second power transistor and includes: a first control gateway, a second control gateway, and an inductor, where: a first end of the first control gateway is connected to a first end of the second control gateway; a second end of the first control gateway is connected to a second end of the second control gateway by using the inductor; and a third end of the first control gateway is connected to the first power transistor, and a third end of the second control gateway is connected to the second power transistor. The resonant gate driver according to an embodiment of the present invention can reduce a driving period and increase a response speed.

17 Claims, 6 Drawing Sheets

(51) Int. Cl.
  *H02M 1/088* (2006.01)
  *H03K 17/687* (2006.01)
  *H03K 17/74* (2006.01)
  *H03K 17/12* (2006.01)
  *H02M 3/158* (2006.01)
  *H02M 1/00* (2006.01)

(52) U.S. Cl.
  CPC ......... *H03K 17/6872* (2013.01); *H03K 17/74* (2013.01); *H02M 3/158* (2013.01); *H02M 2001/009* (2013.01); *H03K 17/12* (2013.01); *H03K 2217/009* (2013.01); *Y02B 70/1425* (2013.01)

(58) Field of Classification Search
  USPC .................................................. 327/108, 109
  See application file for complete search history.

(56) References Cited

U.S. PATENT DOCUMENTS

| | | | |
|---|---|---|---|
| 7,598,792 | B2 | 10/2009 | Liu et al. |
| 7,612,602 | B2 | 11/2009 | Yang et al. |
| 2003/0090918 | A1 | 5/2003 | Shenai |
| 2006/0170042 | A1 | 8/2006 | Yang et al. |
| 2006/0186933 | A1 | 8/2006 | Kimura et al. |
| 2006/0290388 | A1 | 12/2006 | Tolle et al. |
| 2009/0072662 | A1* | 3/2009 | Sadler ................... G06F 1/3203 310/319 |
| 2013/0162322 | A1 | 6/2013 | Tao et al. |
| 2013/0200868 | A1* | 8/2013 | Knoedgen ............... H02M 1/32 323/282 |
| 2014/0043004 | A1* | 2/2014 | Abramov ............ H02M 3/1588 323/283 |

OTHER PUBLICATIONS

Liu et al., "Dual Channel Current-Source Gate Drivers for High-Frequency DC-DC Converters," Third IEEE Conference on Industrial Electronics and Applications, pp. 613-618, Institute of Electrical and Electronics Engineers, New York, New York (Jun. 3-5, 2008).

Trescases et al., "A Survey of Light-Load Efficiency Improvement Techniques for Low-Power DC-DC Converters," $8^{th}$ International Conference on Power—ECCE Asia, The Shilla Jeju, Korea, pp. 326-333, Institute of Electrical and Electronics Engineers, New York, New York (May 30-Jun. 3, 2011).

Yang et al., "A New Dual-Channel Resonant Gate Drive Circuit for Low Gate Drive Loss and Low Switching Loss," IEEE Transactions on Power Electronics, vol. 23, No. 3, pp. 1574-1583, Institute of Electrical and Electronics Engineers, New York, New York (May 2008).

Bathily et al., "A 200-MHz Integrated Buck Converter with Resonant Gate Drivers for an RF Power Amplifier," IEEE Transactions on Power Electronics, vol. 27, No. 2, pp. 610-613, Institute of Electrical and Electronics Engineers, New York, New York (Feb. 2012).

Eberle et al., "A Current Source Gate Driver Achieving Switching Loss Savings and Gate Energy Recovery at 1-MHz," IEEE Transactions on Power Electronics, vol. 23, No. 2, pp. 678-691, Institute of Electrical and Electronics Engineers, New York, New York (Mar. 2008).

Anthony et al., "A First Approach to a Design Method for Resonant Gate Driver Architectures," IEEE Transactions on Power Electronics, vol. 27, No. 8, pp. 3855-3868, Institute of Electrical and Electronics Engineers, New York, New York (Aug. 2012).

* cited by examiner

VOLTAGE REGULATOR AND RESONANT GATE DRIVER THEREOF

CROSS-REFERENCE TO RELATED APPLICATIONS

This application claims priority to Chinese Patent Application No. 201310733241.2, filed on Dec. 26, 2013, which is hereby incorporated by reference in its entirety.

TECHNICAL FIELD

The present invention relates to the field of semiconductor integrated circuits, and in particular, to a voltage regulator and a resonant gate driver of the voltage regulator.

BACKGROUND

Dynamic voltage and frequency scaling (Dynamic voltage and frequency scaling, DVFS) is a technology that effectively reduces power consumption. As density of a design area of a chip increases, a response speed, on-chip integration, and energy efficiency become three corresponding important features of a voltage regulator.

In a basic structure of a voltage regulator, especially in a system with a high on-chip switching frequency, most loss comes from loss of a parasitic capacitor of a power transistor and conduction loss of a body diode. Currently, a structure, of a resonant gate driver (Resonant gate driver), that effectively reduces the foregoing two types of loss has been put forwarded. That is, two PMOS transistors, an affiliated diode of the PMOS transistors, two NMOS transistors, an affiliated diode of the NMOS transistors, and an inductor are used to control turn-on and turn-off of two power transistors. Specifically, a turn-on operation on a power transistor may include a process of charging a parasitic capacitor of the power transistor and a process of discharging an inductor; and a turn-off operation on the power transistor may include a process of discharging the parasitic capacitor of the power transistor and a process of discharging the inductor.

However, as mentioned above, the response speed and on-chip integration are also important features of the voltage regulator. In addition, generally, higher on-chip integration requires a faster response speed. Therefore, a response speed of a driver of the voltage regulator also needs to be increased.

SUMMARY

To solve the foregoing technical problems, according to an embodiment of the present invention, a resonant gate driver is provided and is configured to drive a first power transistor and a second power transistor. The resonant gate driver includes a first control gateway, a second control gateway, and an inductor, where: a first end of the first control gateway is connected to a first end of the second control gateway; a second end of the first control gateway is connected to a second end of the second control gateway by using the inductor; and a third end of the first control gateway is connected to the first power transistor, and a third end of the second control gateway is connected to the second power transistor.

For the foregoing resonant gate driver, in a possible implementation manner, the first control gateway includes a first switch, a third switch, and a fifth switch, and the second control gateway includes a second switch, a fourth switch, and a sixth switch, where: a first contact of the first switch is connected to a first contact of the second switch, and a second contact of the first switch is connected to a second contact of the fifth switch and a first contact of the third switch; a second contact of the second switch is connected to a second contact of the sixth switch and a first contact of the fourth switch; a second contact of the third switch is connected to the first power transistor; a second contact of the fourth switch is connected to the second power transistor; a first contact of the fifth switch and a first contact of the sixth switch are grounded; and an end of the inductor is connected to the second contact of the first switch, and the other end of the inductor is connected to the second contact of the second switch.

For the foregoing resonant gate driver, in a possible implementation manner, the resonant gate driver further includes a power supply, where the power supply is connected to the first contact of the first switch and the first contact of the second switch.

For the foregoing resonant gate driver, in a possible implementation manner, the first switch, the second switch, the third switch, the fourth switch, the fifth switch, and the sixth switch are all semiconductor components.

For the foregoing resonant gate driver, in a possible implementation manner, the semiconductor components are field effect transistors, the first contacts of the first switch, the second switch, the third switch, the fourth switch, the fifth switch and the sixth switch are all source electrodes of the field effect transistors, the second contacts of the first switch, the second switch, the third switch, the fourth switch, the fifth switch, and the sixth switch are all drain electrodes of the field effect transistors, and control ends of the first switch, the second switch, the third switch, the fourth switch, the fifth switch, and the sixth switch are all gate electrodes of the field effect transistors.

For the foregoing resonant gate driver, in a possible implementation manner, the first switch, the second switch, the third switch, and the fourth switch are PMOS transistors, and the fifth switch and the sixth switch are NMOS transistors.

For the foregoing resonant gate driver, in a possible implementation manner, the resonant gate driver further includes a first body diode, a second body diode, a third body diode, a fourth body diode, a fifth body diode, and a sixth body diode, where: an anode of the first body diode is connected to the second contact of the first switch, and a cathode of the first body diode is connected to the first contact of the first switch; an anode of the second body diode is connected to the second contact of the second switch, and a cathode of the second body diode is connected to the first contact of the second switch; an anode of the third body diode is connected to the second contact of the third switch, and a cathode of the third body diode is connected to the first contact of the third switch; an anode of the fourth body diode is connected to the second contact of the fourth switch, and a cathode of the fourth body diode is connected to the first contact of the fourth switch; an anode of the fifth body diode is connected to the first contact of the fifth switch, and a cathode of the fifth body diode is connected to the second contact of the fifth switch; and an anode of the sixth body diode is connected to the first contact of the sixth switch, and a cathode of the sixth body diode is connected to the second contact of the sixth switch.

To solve the foregoing technical problems, according to another embodiment of the present invention, a voltage regulator is provided and includes: a first power transistor, where a first contact of the first power transistor is connected to an end of a power supply; a second power transistor, where a first contact of the second power transistor is connected to the other end of the power supply, and a second contact of the second power transistor is connected to a second contact of the first power transistor; and a resonant gate driver that uses any structure in an embodiment of the present invention, where the resonant gate driver is connected to a control end of the first power transistor and a control end of the second power transistor, and is configured to drive the first power transistor and the second power transistor.

For the foregoing voltage regulator, in a possible implementation manner, the voltage regulator further includes: a feedback inductor, a feedback capacitor, a control circuit, and a modulation circuit, where: an end of the feedback inductor is connected to the second contact of the first power transistor, the other end of the feedback inductor is connected to an end of the feedback capacitor, and the other end of the feedback capacitor is connected to the first contact of the first power transistor; the control circuit is connected to the two ends of the feedback inductor and can generate a control signal according to a voltage of the two ends of the feedback inductor; the modulation circuit is connected to the control circuit and can generate a modulating signal according to the control signal; and the resonant gate driver is connected to the modulation circuit and can drive the first power transistor and the second power transistor according to the modulating signal.

For the foregoing voltage regulator, in a possible implementation manner, the first power transistor is an NMOS transistor, and the second power transistor is a PMOS transistor.

For the foregoing voltage regulator, in a possible implementation manner, the first contact of the first power transistor is a source electrode of the NMOS transistor, the second contact of the first power transistor is a drain electrode of the NMOS transistor, and the control end of the first power transistor is a gate electrode of the NMOS transistor; and the first contact of the second power transistor is a source electrode of the PMOS transistor, the second contact of the second power transistor is a drain electrode of the PMOS transistor, and the control end of the second power transistor is a gate electrode of the PMOS transistor.

The resonant gate driver in the embodiments of the present invention saves time for two times of inductor discharging in the prior art, and therefore when compared with the prior art, shortens a driving period by about 25% and increases a response speed.

Exemplary embodiments are described in detail with reference to accompanying drawings to make other features and aspects of the present invention clearer.

BRIEF DESCRIPTION OF DRAWINGS

Accompanying drawings included in the specification and constructing a part of the specification jointly show the exemplary embodiments, characteristics and aspects of the present invention, and are intended to explain the principles of the present invention.

DESCRIPTION OF EMBODIMENTS

The following describes, with reference to the accompanying drawings, various exemplary embodiments, features, and aspects of the present invention in detail. A same mark in the accompanying drawings indicates a same function or a similar component. Though various aspects of the embodiments are shown in the accompanying drawings, unless otherwise specified, the accompanying drawings do not need to be drawn proportionally.

The specific term "exemplary" herein means "used as an example, embodiment or illustrative". Any embodiment described as "exemplary" is not necessarily explained as being superior or better than other embodiments.

In addition, for better description of the present invention, a lot of specific details are provided in the following specific implementation manners A person of ordinary skill in the art should understand that the present invention may also be implemented without the specific details. In another some embodiments, common methods, means, components, and circuits are not described in detail for the convenience of highlighting the major idea of the present invention.

Figure 1:
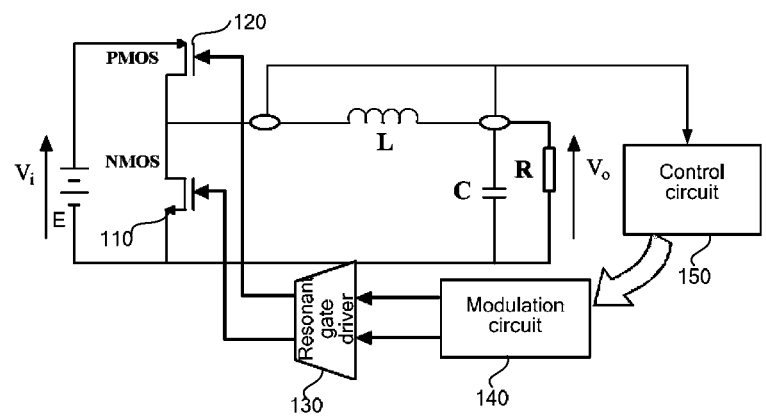
FIG. 1 shows a schematic structural diagram of a voltage regulator according to an embodiment of the present invention.

A resonant gate driver in an embodiment of the present invention is configured to drive a first power transistor and a second power transistor and may perform, by controlling a time ratio of connection and disconnection of the two power transistors in a voltage regulator shown in FIG. 1, pulse modulation on an input voltage Vi, thereby making an output voltage Vo adjustable and maintain stable, where a first power transistor 110 shown in FIG. 1 may be specifically an NMOS transistor, and a second power transistor 120 may be specifically a PMOS transistor.

Figure 2:
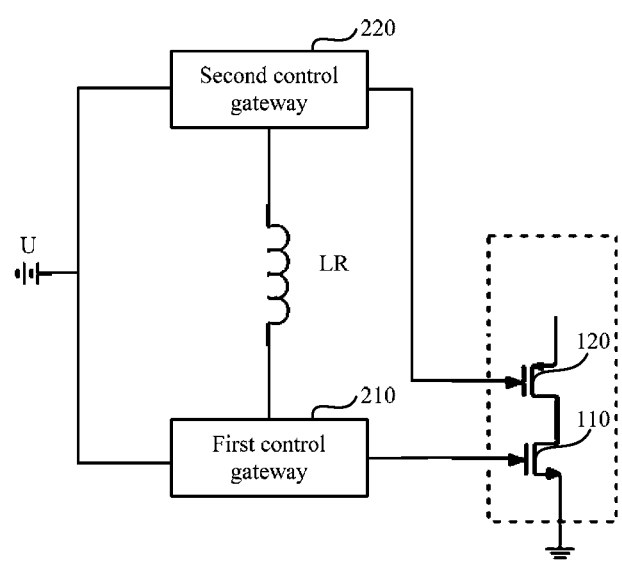
FIG. 2 shows a schematic structural diagram of a resonant gate driver according to an embodiment of the present invention.

FIG. 2 shows a schematic structural diagram of a resonant gate driver according to an embodiment of the present invention. As shown in FIG. 2, the resonant gate driver mainly includes a first control gateway 210, a second control gateway 220, and an inductor $L_R$, where: a first end of the first control gateway 210 is connected to a first end of the second control gateway 220; a second end of the first control gateway 210 is connected to a second end of the second control gateway 220 by using the inductor $L_R$; and a third end of the first control gateway 210 is connected to a first power transistor 110, and a third end of the second control gateway 220 is connected to a second power transistor 120.

By using a control gateway 150 and a modulation circuit 140 that are described in FIG. 1, an intensity of a current that passes through the first control gateway 210 and the second control gateway 220 of the resonant gate driver in the present invention may be controlled. Therefore, connection and disconnection of the first power transistor 110 and the second power transistor 120 can be controlled and pulse modulation on an input voltage Vi shown in FIG. 1 is implemented.

Figure 3:
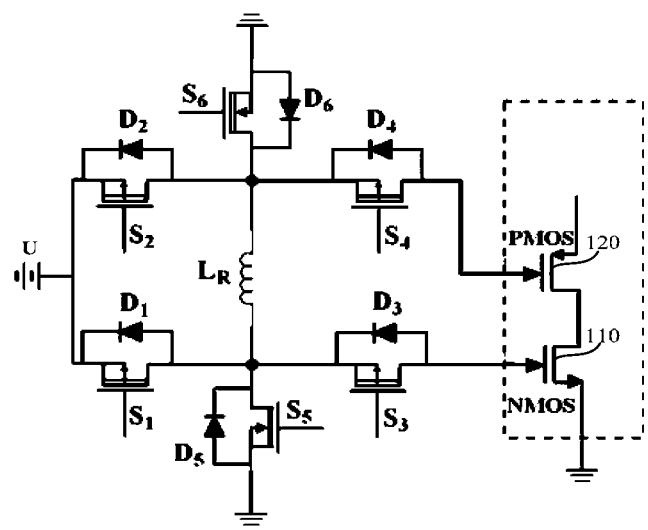
FIG. 3 shows a specific circuit structural diagram of a resonant gate driver according to an embodiment of the present invention.

In a possible implementation manner, a specific circuit structural diagram of the resonant gate driver in an embodiment of the present invention is shown in FIG. 3. The first control gateway 210 includes a first switch $S_1$, a third switch $S_3$, and a fifth switch $S_5$, and the second control gateway 220 includes a second switch $S_2$, a fourth switch $S_4$, and a sixth switch $S_6$, where: a first contact of the first switch $S_1$ is connected to a first contact of the second switch $S_2$, and a second contact of the first switch $S_1$ is connected to a second contact of the fifth switch $S_5$ and a first contact of the third switch $S_3$; a second contact of the second switch $S_2$ is connected to a second contact of the sixth switch $S_6$ and a first contact of the fourth switch $S_4$; a second contact of the third switch $S_3$ is connected to the first power transistor 110; a second contact of the fourth switch $S_4$ is connected to the second power transistor 120; a first contact of the fifth switch $S_5$ and a first contact of the sixth switch $S_6$ are grounded; and an end of the inductor $L_R$ is connected to the second contact of the first switch $S_1$, and the other end of the inductor $L_R$ is connected to the second contact of the second switch $S_2$.

In a possible implementation manner, as shown in FIG. 3, the resonant gate driver according to an embodiment of the present invention may further include a power supply U, where the power supply U is connected to the first contact of the first switch $S_1$ and the first contact of the second switch $S_2$.

In a possible implementation manner, the first switch $S_1$, the second switch $S_2$, the third switch $S_3$, the fourth switch $S_4$, the fifth switch $S_5$ and the sixth switch $S_6$ are all semiconductor components. In a possible implementation manner, the semiconductor components are field effect transistors, the first contacts of the first switch $S_1$, the second switch $S_2$, the third switch $S_3$, the fourth switch $S_4$, the fifth switch $S_5$ and the sixth switch $S_6$ are all source electrodes of the field effect transistors, the second contacts of the first switch $S_1$, the second switch $S_2$, the third switch $S_3$, the fourth switch $S_4$, the fifth switch $S_5$ and the sixth switch $S_6$ are all drain electrodes of the field effect transistors, control ends of the first switch $S_1$, the second switch $S_2$, the third switch $S_3$, the fourth switch $S_4$, the fifth switch $S_5$ and the sixth switch $S_6$ are all gate electrodes of the field effect transistors, and the gate electrodes are connected to the modulation circuit 140 shown in FIG. 1, and can be controlled by the control gateway 150 by using the modulation circuit 140.

In a possible implementation manner, the first switch $S_1$, the second switch $S_2$, the third switch $S_3$, and the fourth switch $S_4$ are PMOS transistors, and the fifth switch $S_5$ and the sixth switch $S_6$ are NMOS transistors.

In a possible implementation manner, as shown in FIG. 3, the resonant gate driver according to an embodiment of the present invention may further include a first body diode $D_1$, a second body diode $D_2$, a third body diode $D_3$, a fourth body diode $D_4$, a fifth body diode $D_5$, and a sixth body diode $D_6$, where: an anode of the first body diode $D_1$ is connected to the second contact of the first switch $S_1$, and a cathode of the first body diode $D_1$ is connected to the first contact of the first switch $S_1$; an anode of the second body diode $D_2$ is connected to the second contact of the second switch $S_2$, and a cathode of the second body diode $D_2$ is connected to the first contact of the second switch $S_2$; an anode of the third body diode $D_3$ is connected to the second contact of the third switch $S_3$, and a cathode of the third body diode $D_3$ is connected to the first contact of the third switch $S_3$; an anode of the fourth body diode $D_4$ is connected to the second contact of the fourth switch $S_4$, and a cathode of the fourth body diode $D_4$ is connected to the first contact of the fourth switch $S_4$; an anode of the fifth body diode $D_5$ is connected to the first contact of the fifth switch $S_5$, and a cathode of the fifth body diode $D_5$ is connected to the second contact of the fifth switch $S_5$; and an anode of the sixth body diode $D_6$ is connected to the first contact of the sixth switch $S_6$, and a cathode of the sixth body diode $D_6$ is connected to the second contact of the sixth switch $S_6$. Existence of the body diodes may reduce reverse loss in a circuit and can achieve a purpose of protecting the switches.

Figure 4A:
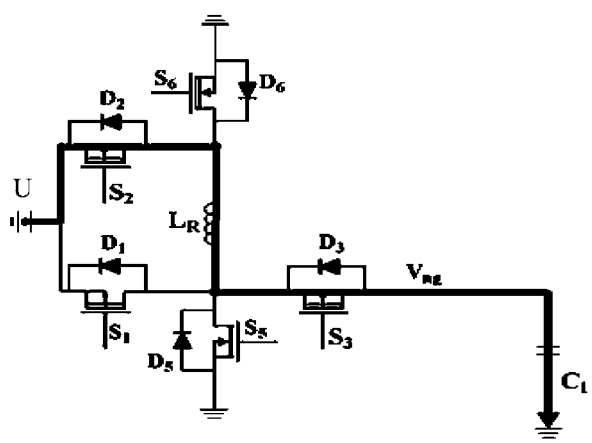
FIG. 4a to FIG. 4c show schematic diagrams of a procedure in which a resonant gate driver drives a power transistor to turn on and turn off according to an embodiment of the present invention.
Figure 4B:
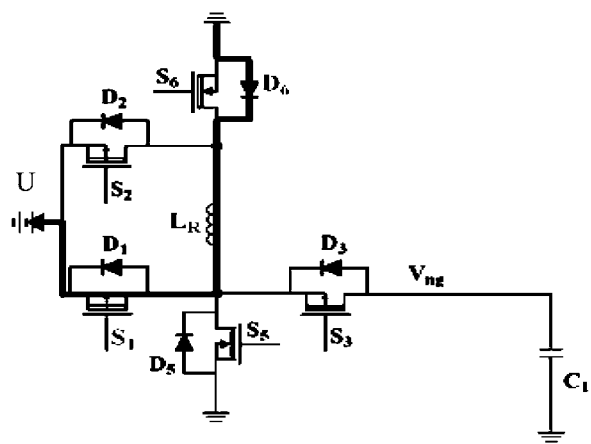
Figure 4C:
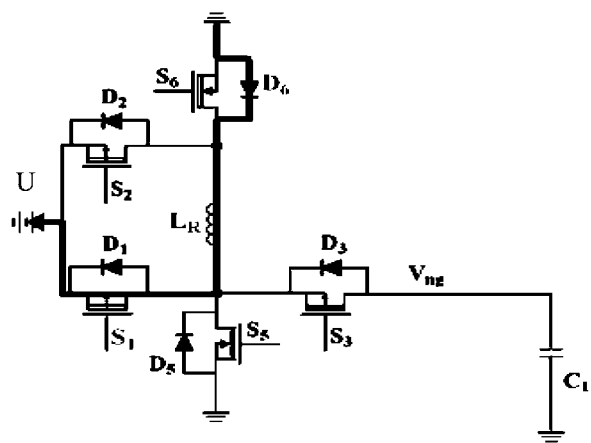
Figure 5A:
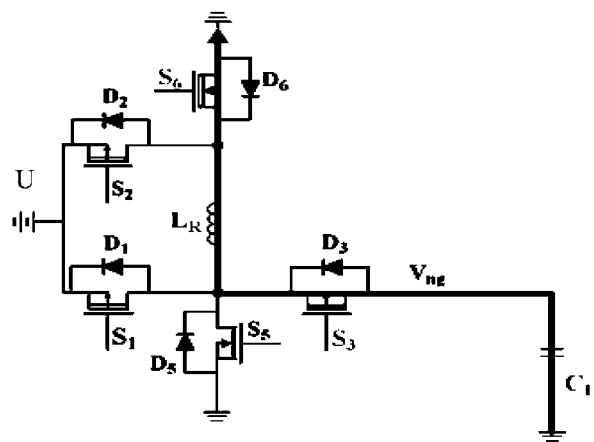
FIG. 5a to FIG. 5c show schematic diagrams of a procedure in which a resonant gate driver drives another power transistor to turn on and turn off according to an embodiment of the present invention.
Figure 5B:
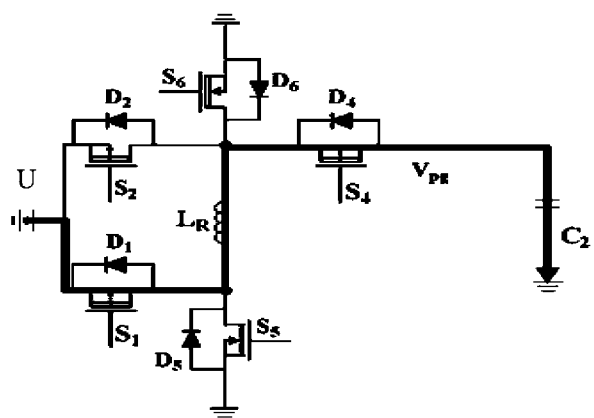
Figure 5C:
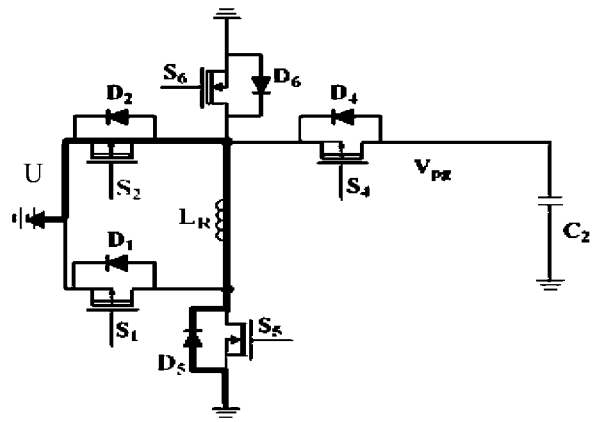

FIG. 4a to FIG. 4c show diagrams of a simplified procedure in which the resonant gate deriver turns on and turns off the first power transistor 110 according to an embodiment of the present invention. Specifically, FIG. 4a is a process of turning on the first power transistor 110, that is, charging a parasitic capacitor C1 of the first power transistor 110. By controlling a voltage of the control end of the second switch S2, the second switch S2 is connected, and therefore the parasitic capacitor C1 can be charged. After a period of time, the power transistor 110 is connected when a voltage of a gate electrode of the first power transistor 110 exceeds a threshold voltage. Then, as shown in FIG. 4b, FIG. 4b is a process of discharging the inductor LR, where energy of the inductor LR is returned to the power supply U in this process, which can save energy. FIG. 4c is a process of turning off the power transistor 110, that is, a process of discharging the parasitic capacitor C1 of the first power transistor 110. By controlling a voltage of the control end of the sixth switch S6, the sixth switch S6 is connected, and therefore the parasitic capacitor C1 can be discharged by using the inductor LR. FIG. 5a to FIG. 5c show diagrams of a simplified procedure of a process in which the second power transistor 120 is turned on and turned off, that is, a process in which the parasitic capacitor $C_2$ of the second power transistor 120 is charged and discharged. For a detailed procedure, reference may be made to the foregoing procedure of turning on and turning off the first power transistor 110.

It should be noted that connection and disconnection of all the first switch $S_1$, the second switch $S_2$, the third switch $S_3$, the fourth switch $S_4$, the fifth switch $S_5$ and the sixth switch $S_6$ may be logically controlled by the modulation circuit 140. When a voltage of the control end of the foregoing switch is logically controlled at a high level, the switch is connected; and when the voltage of the control end of the foregoing switch is logically controlled at a low level, the switch is disconnected. In an actual application, a moment when the control end of each of the foregoing switches needs to be controlled at a high level or a low level may be preset in the modulation circuit 140 according to an actual requirement. In addition, a person skilled in the art should understand that the foregoing switches may also be switch tubes that have a similar function.

In a driving period of the voltage regulator shown in FIG. 1, the resonant gate driver in this embodiment needs to perform a turn-on operation and a turn-off operation on power transistors twice, that is, turn on the first power transistor 110 and turn off the first power transistor 110, and turn on the second power transistor 120 and turn off the second power transistor 120.

According to the foregoing analysis, driving a single power transistor by the resonant gate driver in this embodiment may be concluded as the following three steps, and in a driving period, the following steps are performed twice:

step 01: a process of charging the parasitic capacitor.
    step 02: Discharge the inductor and return energy.
    step 03: Discharge the parasitic capacitor and store energy of the inductor.

Driving a single power transistor by using a structure of an existing resonant gate driver described in the BACKGROUND may be concluded as the following four steps, and in a driving period, the following steps are performed twice:

step 11: a process of charging the parasitic capacitor;
step 12: Discharge the inductor and return energy;
step 13: Discharge the parasitic capacitor and store energy of the inductor; and
step 14: Discharge the inductor and return energy.

Figure 6:
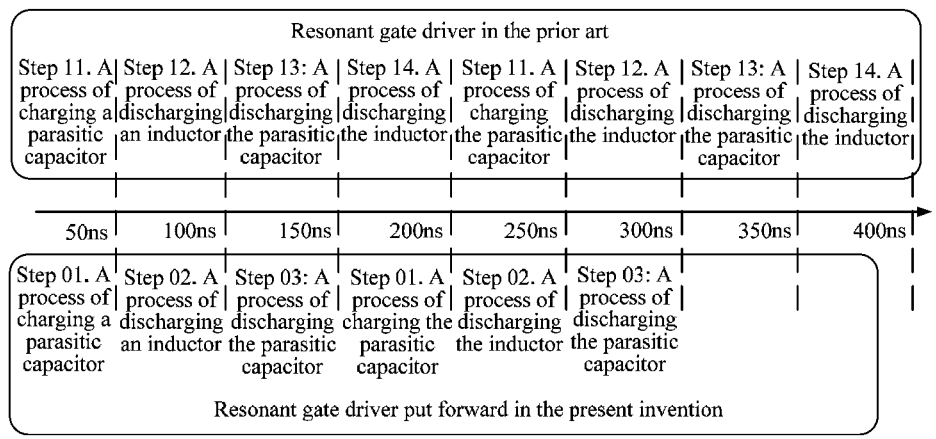
FIG. 6 shows a schematic diagram of comparison between a driving period of a resonant gate driver according to an embodiment of the present invention and that of a resonant gate driver in the prior art.

If 50 ns is used as a step unit of a driving period of the resonant gate driver, a simulation test on power transistor driving by the resonant gate driver in the prior art and the resonant gate driver in this embodiment of the present invention is performed, and a schematic diagram of comparison between driving periods of two structures may be obtained. As shown in FIG. 6, it may be seen that the resonant gate driver in this embodiment of the present invention saves time of two times of inductor discharging in the prior art, and therefore when compared with the prior art, shortens the driving period by about 25% and increases a response speed. In addition, compared with the prior art, the resonant gate driver in this embodiment of the present invention reduces a step of driving the power resonant, and therefore can reduce complexity of a logical unit that is responsible for controlling a switch of the resonant gate driver.

It should be noted that, although a driving circuit that is applied to a voltage regulator is used as an example to describe the resonant gate driver put forward in the present invention, a person skilled in the art should understand that an application scenario of the present invention should not be limited thereto. The new-type resonant gate driver put forward in the present invention can also be applied to another similar circuit, for example, a driving circuit of a power switch component. In addition, although the foregoing embodiment uses FIG. 4a to FIG. 4c and FIG. 5a to FIG. 5c as an example to describe in detail a possible implementation manner of the resonant gate driver in the present invention, a person skilled in the art should understand that a specific current direction of the resonant gate driver in the present invention should not be limited thereto, and a logical level value of the control end of each switch can be flexibly set according to an application scenario. All structures that use the resonant gate driver described in the claims shall fall within a scope of the present invention.

FIG. 1 shows a structural diagram of a voltage regulator according to an embodiment of the present invention. The voltage regulator may include a first power transistor 110, a second power transistor 120, and a resonant gate driver 130, where: a first contact of the first power transistor 110 is connected to an end of a power supply E; a first contact of the second power transistor 120 is connected to the other end of the power supply E, and a second contact of the second power transistor 120 is connected to a second contact of the first power transistor 110; and the resonant gate driver 130 is connected to a control end of the first power transistor 110 and a control end of the second power transistor 120 by using a circuit structure described in the foregoing embodiment of the present invention, and can drive turn-on and turn-off of the first power transistor 110 and the second power transistor 120.

In a possible implementation manner, the voltage regulator further includes: a feedback inductor L, a feedback capacitor C, a control circuit 150, and a modulation circuit 140, where: an end of the feedback inductor L is connected to the second contact of the first power transistor 110, the other end of the feedback inductor L is connected to an end of the feedback capacitor C, and the other end of the feedback capacitor C is connected to the first contact of the first power transistor 110; the control circuit 150 is connected to the two ends of the feedback inductor L and can generate a control signal according to a voltage of the two ends of the feedback inductor L; the modulation circuit 140 is connected to the control circuit 150 and can generate a modulating signal according to the control signal; and the resonant gate driver 130 is connected to the modulation circuit 140 and can drive the first power transistor 110 and the second power transistor 120 according to the modulating signal.

In a possible implementation manner, the first power transistor 110 is an NMOS transistor, and the second power transistor 120 is a PMOS transistor.

In a possible implementation manner, the first contact of the first power transistor is a source electrode of the NMOS transistor, the second contact of the first power transistor 110 is a drain electrode of the NMOS transistor, the control end of the first power transistor 110 is a gate electrode of the NMOS transistor; and the first contact of the second power transistor 120 is a source electrode of the PMOS transistor, the second contact of the second power transistor 120 is a drain electrode of the PMOS transistor, and the control end of the second power transistor 120 is a gate electrode of the PMOS transistor.

For control on the first power transistor 110 and the second power transistor 120 by the resonant gate driver 130, reference may be specifically made to the foregoing embodiment and descriptions from FIG. 4a to FIG. 4c and from FIG. 5a to FIG. 5c. By controlling connection and disconnection of the first power transistor 110 and the second power transistor 120, pulse modulation is implemented on an input voltage Vi shown in FIG. 1.

In addition, it should be noted that, when the resonant gate driver with a structure shown in FIG. 3 is used, connection and disconnection of the first switch $S_1$, the second switch $S_2$, the third switch $S_3$, the fourth switch $S_4$, the fifth switch $S_5$ and the sixth switch $S_6$ in the resonant gate driver may be logically controlled by the modulation circuit 140. That is, when a voltage of the control end of the foregoing switch is logically controlled at a high level, the switch is connected; and when the voltage of the control end of the foregoing switch is logically controlled at a low level, the switch is disconnected. In an actual application, a moment when the control end of each of the foregoing switches needs to be controlled at a high level or a low level may be preset in the modulation circuit 140 according to an actual requirement.

A voltage regulator in this embodiment uses a resonant gate driver described in the foregoing embodiment of the present invention and can increase a response speed, which is more helpful to on-chip integration of the voltage regulator. In addition, the voltage regulator in this embodiment of the present invention can reduce complexity of a logical unit, that is, a modulation circuit, that is responsible for controlling a switch of the resonant gate driver.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A resonant gate driver of a voltage regulator configured to drive a first power transistor and a second power transistor, wherein the resonant gate driver comprises a first control gateway, a second control gateway, and an inductor, wherein:
- a first end of the first control gateway is connected to a first end of the second control gateway;
- a second end of the first control gateway is connected to a second end of the second control gateway via the inductor; and
- a third end of the first control gateway is connected to the first power transistor, and a third end of the second control gateway is connected to the second power transistor;
- wherein the first end of the first control gateway and the first end of the second control gateway are connected to a modulation circuit of the voltage regulator, the modulation circuit being connected to a control circuit of the voltage regulator;
- wherein the modulation circuit and the control circuit are configured to control an intensity of a current passing through the first control gateway and the second control gateway to control a time ratio of connection and disconnection of the first power transistor and the second power transistor, so as to perform pulse modulation on an input voltage of the voltage regulator to keep an output voltage of the voltage regulator stable.

2. The resonant gate driver according to claim 1, wherein the first control gateway comprises a first switch, a third switch, and a fifth switch, and the second control gateway comprises a second switch, a fourth switch, and a sixth switch, wherein:
- a first contact of the first switch is connected to a first contact of the second switch, and a second contact of the first switch is connected to a second contact of the fifth switch and a first contact of the third switch;
- a second contact of the second switch is connected to a second contact of the sixth switch and a first contact of the fourth switch;
- a second contact of the third switch is connected to the first power transistor;
- a second contact of the fourth switch is connected to the second power transistor;
- a first contact of the fifth switch and a first contact of the sixth switch are grounded; and
- an end of the inductor is connected to the second contact of the first switch, and the other end of the inductor is connected to the second contact of the second switch.

3. The resonant gate driver according to claim 2, further comprising a power supply, wherein the power supply is connected to the first contact of the first switch and the first contact of the second switch.

4. The resonant gate driver according to claim 2, wherein the first switch, the second switch, the third switch, the fourth switch, the fifth switch, and the sixth switch are all semiconductor components.

5. The resonant gate driver according to claim 4, wherein the semiconductor components are field effect transistors, the first contacts of the first switch, the second switch, the third switch, the fourth switch, the fifth switch and the sixth switch are all source electrodes of the field effect transistors, the second contacts of the first switch, the second switch, the third switch, the fourth switch, the fifth switch, and the sixth switch are all drain electrodes of the field effect transistors, and control ends of the first switch, the second switch, the third switch, the fourth switch, the fifth switch, and the sixth switch are all gate electrodes of the field effect transistors.

6. The resonant gate driver according to claim 5, wherein the first switch, the second switch, the third switch, and the fourth switch are p-type metal-oxide-semiconductor (PMOS) transistors, and the fifth switch and the sixth switch are n-type metal-oxide-semiconductor (NMOS) transistors.

7. The resonant gate driver according to claim 6, further comprising a first body diode, a second body diode, a third body diode, a fourth body diode, a fifth body diode, and a sixth body diode, wherein:
- an anode of the first body diode is connected to the second contact of the first switch, and a cathode of the first body diode is connected to the first contact of the first switch;
- an anode of the second body diode is connected to the second contact of the second switch, and a cathode of the second body diode is connected to the first contact of the second switch;
- an anode of the third body diode is connected to the second contact of the third switch, and a cathode of the third body diode is connected to the first contact of the third switch;
- an anode of the fourth body diode is connected to the second contact of the fourth switch, and a cathode of the fourth body diode is connected to the first contact of the fourth switch;
- an anode of the fifth body diode is connected to the first contact of the fifth switch, and a cathode of the fifth body diode is connected to the second contact of the fifth switch; and
- an anode of the sixth body diode is connected to the first contact of the sixth switch, and a cathode of the sixth body diode is connected to the second contact of the sixth switch.

8. A voltage regulator, comprising:
- a first power transistor, wherein a first contact of the first power transistor is connected to an end of a power supply;
- a second power transistor, wherein a first contact of the second power transistor is connected to the other end of the power supply, and a second contact of the second power transistor is connected to a second contact of the first power transistor; and
- a resonant gate driver, wherein the resonant gate driver is connected to a control end of the first power transistor and a control end of the second power transistor, and is configured to drive the first power transistor and the second power transistor;
- wherein the resonant gate driver comprises a first control gateway, a second control gateway, and an inductor, and wherein: a first end of the first control gateway is connected to a first end of the second control gateway; a second end of the first control gateway is connected to a second end of the second control gateway via the inductor; and a third end of the first control gateway is connected to the first power transistor, and a third end of the second control gateway is connected to the second power transistor;
- wherein the first end of the first control gateway and the first end of the second control gateway are connected to a modulation circuit of the voltage regulator, the modulation circuit being connected to a control circuit of the voltage regulator;
- wherein the modulation circuit and the control circuit are configured to control an intensity of a current passing through the first control gateway and the second control gateway to control a time ratio of connection and disconnection of the first power transistor and the second power transistor, so as to perform pulse modulation on an input voltage of the voltage regulator to keep an output voltage of the voltage regulator stable.

9. The voltage regulator according to claim 8, further comprising: a feedback inductor, and a feedback capacitor, wherein:
an end of the feedback inductor is connected to the second contact of the first power transistor, the other end of the feedback inductor is connected to an end of the feedback capacitor, and the other end of the feedback capacitor is connected to the first contact of the first power transistor;
the control circuit is connected to the two ends of the feedback inductor and is configured to generate a control signal according to a voltage corresponding to the two ends of the feedback inductor;
the modulation circuit is connected to the control circuit and is configured to generate a modulating signal according to the control signal; and
the resonant gate driver is connected to the modulation circuit and is configured to drive the first power transistor and the second power transistor according to the modulating signal.

10. The voltage regulator according to claim 8, wherein the first power transistor is an n-type metal-oxide-semiconductor (NMOS) transistor, and the second power transistor is a p-type metal-oxide-semiconductor (PMOS) transistor.

11. The voltage regulator according to claim 10, wherein:
the first contact of the first power transistor is a source electrode of the NMOS transistor, the second contact of the first power transistor is a drain electrode of the NMOS transistor, and the control end of the first power transistor is a gate electrode of the NMOS transistor; and
the first contact of the second power transistor is a source electrode of the PMOS transistor, the second contact of the second power transistor is a drain electrode of the PMOS transistor, and the control end of the second power transistor is a gate electrode of the PMOS transistor.

12. The voltage regulator according to claim 8, wherein the first control gateway comprises a first switch, a third switch, and a fifth switch, and the second control gateway comprises a second switch, a fourth switch, and a sixth switch, wherein:
a first contact of the first switch is connected to a first contact of the second switch, and a second contact of the first switch is connected to a second contact of the fifth switch and a first contact of the third switch;
a second contact of the second switch is connected to a second contact of the sixth switch and a first contact of the fourth switch;
a second contact of the third switch is connected to the first power transistor;
a second contact of the fourth switch is connected to the second power transistor;
a first contact of the fifth switch and a first contact of the sixth switch are grounded; and
an end of the inductor is connected to the second contact of the first switch, and the other end of the inductor is connected to the second contact of the second switch.

13. The voltage regulator according to claim 12, further comprising a power supply, wherein the power supply is connected to the first contact of the first switch and the first contact of the second switch.

14. The voltage regulator, according to claim 12, wherein the first switch, the second switch, the third switch, the fourth switch, the fifth switch, and the sixth switch are all semiconductor components.

15. The voltage regulator according to claim 14, wherein the semiconductor components are field effect transistors, the first contacts of the first switch, the second switch, the third switch, the fourth switch, the fifth switch and the sixth switch are all source electrodes of the field effect transistors, the second contacts of the first switch, the second switch, the third switch, the fourth switch, the fifth switch, and the sixth switch are all drain electrodes of the field effect transistors, and control ends of the first switch, the second switch, the third switch, the fourth switch, the fifth switch, and the sixth switch are all gate electrodes of the field effect transistors.

16. The voltage regulator according to claim 15, wherein the first switch, the second switch, the third switch, and the fourth switch are p-type metal-oxide-semiconductor (PMOS) transistors, and the fifth switch and the sixth switch are n-type metal-oxide-semiconductor (NMOS) transistors.

17. The voltage regulator according to claim 16, further comprising a first body diode, a second body diode, a third body diode, a fourth body diode, a fifth body diode, and a sixth body diode, wherein:
an anode of the first body diode is connected to the second contact of the first switch, and a cathode of the first body diode is connected to the first contact of the first switch;
an anode of the second body diode is connected to the second contact of the second switch, and a cathode of the second body diode is connected to the first contact of the second switch;
an anode of the third body diode is connected to the second contact of the third switch, and a cathode of the third body diode is connected to the first contact of the third switch;
an anode of the fourth body diode is connected to the second contact of the fourth switch, and a cathode of the fourth body diode is connected to the first contact of the fourth switch;
an anode of the fifth body diode is connected to the first contact of the fifth switch, and a cathode of the fifth body diode is connected to the second contact of the fifth switch; and
an anode of the sixth body diode is connected to the first contact of the sixth switch, and a cathode of the sixth body diode is connected to the second contact of the sixth switch.

* * * * *